(12) United States Patent
Sastry et al.

(10) Patent No.: US 8,852,316 B2
(45) Date of Patent: Oct. 7, 2014

(54) PROCESS FOR THE PREPARATION OF SILVER NANO PARTICLES

(75) Inventors: Murali Sastry, Pune (IN); Madakasira Narasimhachary Shashikala, Pune (IN); Sumant Phadtare, Pune (IN)

(73) Assignee: TATA Chemicals Limited, Mumbai (IN)

( * ) Notice: Subject to any disclaimer, the term of this patent is extended or adjusted under 35 U.S.C. 154(b) by 483 days.

(21) Appl. No.: 12/933,869

(22) PCT Filed: Apr. 28, 2009

(86) PCT No.: PCT/IB2009/005401
§ 371 (c)(1),
(2), (4) Date: Sep. 21, 2010

(87) PCT Pub. No.: WO2009/133446
PCT Pub. Date: Nov. 5, 2009

(65) Prior Publication Data
US 2011/0017019 A1    Jan. 27, 2011

(30) Foreign Application Priority Data
Apr. 28, 2008   (IN) .......................... 936/MUM/2008

(51) Int. Cl.
| | | |
|---|---|---|
| *B22F 9/24* | (2006.01) |
| *B82Y 40/00* | (2011.01) |
| *C30B 29/60* | (2006.01) |
| *C30B 29/02* | (2006.01) |
| *C30B 7/00* | (2006.01) |
| *B82Y 30/00* | (2011.01) |
| *B82Y 15/00* | (2011.01) |
| *B22F 1/00* | (2006.01) |

(52) U.S. Cl.
CPC . *B22F 9/24* (2013.01); *C30B 29/60* (2013.01); *C30B 29/02* (2013.01); *C30B 7/00* (2013.01); *B82Y 30/00* (2013.01); *B82Y 15/00* (2013.01); B22F 2301/255 (2013.01); *B82Y 40/00* (2013.01); *B22F 1/0018* (2013.01); Y10S 977/896 (2013.01)

USPC .............................. 75/371; 75/741; 977/896

(58) Field of Classification Search
None
See application file for complete search history.

(56) References Cited

U.S. PATENT DOCUMENTS

| | | |
|---|---|---|
| 6,183,545 B1 | 2/2001 | Okuhama et al. |
| 6,262,129 B1 | 7/2001 | Murray et al. |
| 6,572,673 B2 | 6/2003 | Lee et al. |
| 6,660,058 B1 | 12/2003 | Oh et al. |
| 7,615,096 B1 * | 11/2009 | Tai et al. .......................... 75/333 |
| 2002/0194958 A1 | 12/2002 | Lee et al. |
| 2007/0034052 A1 | 2/2007 | Vanheusden et al. |
| 2007/0234851 A1 * | 10/2007 | Goia et al. ....................... 75/371 |
| 2007/0275259 A1 | 11/2007 | Lee et al. |
| 2008/0032047 A1 * | 2/2008 | Parashar et al. ............. 427/372.2 |
| 2008/0034921 A1 * | 2/2008 | Vanheusden et al. ........... 75/362 |
| 2010/0101637 A1 * | 4/2010 | Yamasaki et al. ............. 136/252 |

FOREIGN PATENT DOCUMENTS

| | | |
|---|---|---|
| CN | 1709618 | 12/2005 |
| EP | 977212 B1 | 5/2003 |
| JP | 2004043892 | 2/2004 |
| KR | 20040078853 | 9/2004 |
| KR | 100547596 | 1/2006 |
| WO | WO 02/48432 | 6/2002 |
| WO | WO 2007/095058 | 8/2007 |

OTHER PUBLICATIONS

International Search Report and Written Opinion issued in PCT/IB2009/005401 dated Aug. 21, 2009, 12 pages.

* cited by examiner

*Primary Examiner* — George Wyszomierski
(74) *Attorney, Agent, or Firm* — Klarquist Sparkman, LLP

(57) ABSTRACT

The invention relates to a process for the preparation of silver nano particles comprising dissolving a surfactant in ethanol to obtain a first solution; dissolving a silver precursor in water to obtain a second solution; adding the second solution to the first solution to obtain a third solution; dissolving a reducing agent in water to obtain a reducing agent solution and adding the reducing agent solution to the third solution to obtain silver nano particles.

28 Claims, 2 Drawing Sheets

PROCESS FOR THE PREPARATION OF SILVER NANO PARTICLES

CROSS REFERENCE TO RELATED APPLICATIONS

Figure 1:
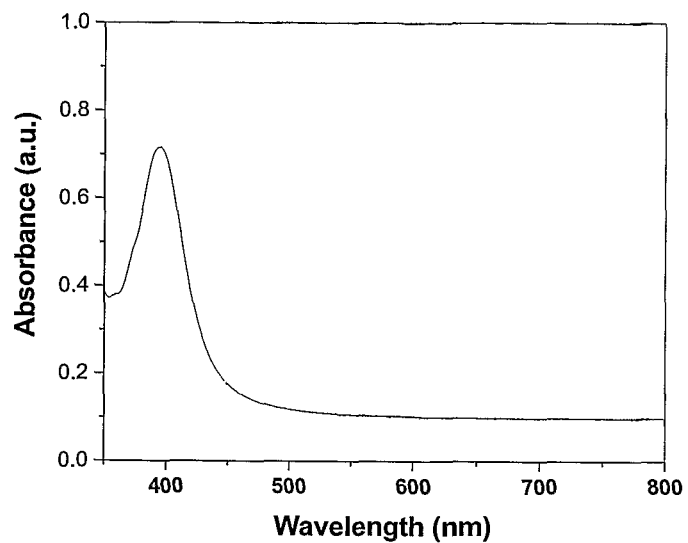

This is the U.S. National Stage of International Application No. PCT/IB2009/005401 filed Apr. 28, 2009, which was published in English under PCT Article 21(2), which in turn claims the benefit of Indian Application No. 936/MUM/2008, filed Apr. 28, 2008, all of which are incorporated herein by reference in their entirety.

The invention relates to a process for preparation of nano particles. More particularly the invention relates to a process for the preparation of silver nano particles.

DESCRIPTION OF RELATED ART

The term "nano" or nano particles is generally used to refer to particles having a diameter of less than about 100 nm. Metal nano particles of average diameter ranging from 10 to 200 nm have potential application in chemical catalysis, photo electronics, microelectronics, optoelectronics, information storage, photography, imaging, sensing, biological labeling etc. Silver nano-particles are especially important as conductive elements for electronic devices as they are cheaper than gold and are more stable as compared to copper.

Several methods for synthesis of silver nano particles in aqueous as well as organic medium are known. However there is limited disclosure of the synthesis of silver nano particles at high molar concentration. In particular, there are no commercially viable method for the synthesis of silver nano particles at high molar concentrations in an aqueous medium. Some methods such as that described in US 2007/0034052 disclose molar concentrations of up to 0.75 moles. However, these processes require complicated steps that involve heating and cooling of the reaction mixture, making such process expensive and unsuitable for the production of silver nano particles at high concentration in an economically viable manner.

There is therefore a need to identify a process for production of high molar concentration of nano-particles of silver in an aqueous medium. Moreover there is a need to identify a simple process by which the production of nano particles of silver takes place at ambient temperature and pressure. It is desirable that the nano particles formed are stable and do not aggregate. It is also desirable that the nano particles so formed are readily dispersible in an aqueous and organic medium.

SUMMARY

The invention relates to a process for the preparation of silver nano particles comprising dissolving a surfactant in ethanol to obtain a first solution; dissolving a silver precursor in water to obtain a second solution; adding the second solution to the first solution to obtain a third solution; dissolving a reducing agent in water to obtain a reducing agent solution and adding the reducing agent solution to the third solution to obtain silver nano particles.

The invention relates to a process for the preparation of silver nano particles comprising dissolving a surfactant in water and ethanol to obtain a first solution; dissolving a silver precursor in water to obtain a second solution; adding the second solution to the first solution to obtain a third solution; dissolving a reducing agent in water to obtain a reducing agent solution and adding the reducing agent solution to the third solution to obtain silver nano particles.

According to an aspect of the invention the silver nano particles obtained by the addition of the reducing agent solution to the first solution are dried to form powder.

BRIEF DESCRIPTION OF ACCOMPANYING DRAWINGS

The accompanying drawings illustrate the preferred embodiments of the invention and together with the following detailed description serve to explain the principles of the invention.

FIG. 1: UV-visible spectra for a sample of silver nano particles synthesized in aqueous medium FIG. 2: UV-visible spectra of silver nano particles powder re-dispersed in aqueous medium (0.4 mg/mL)

Figure 3:
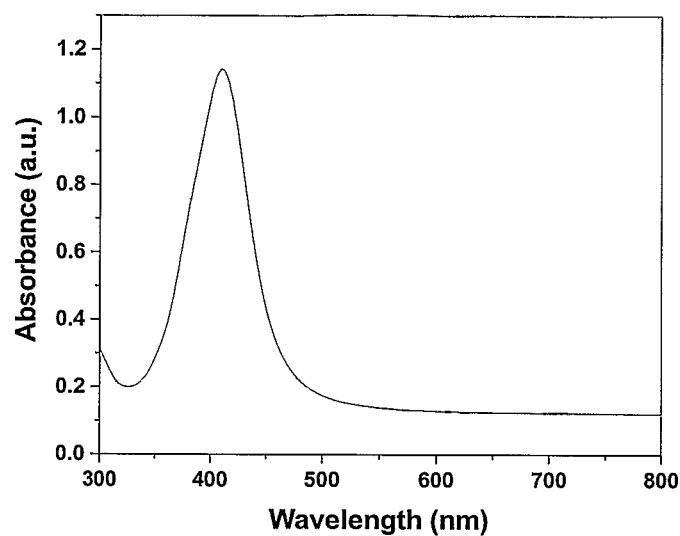

FIG. 3: UV-visible spectra of silver nano particles powder re-dispersed in organic medium (1 mg/mL)

Figure 4:
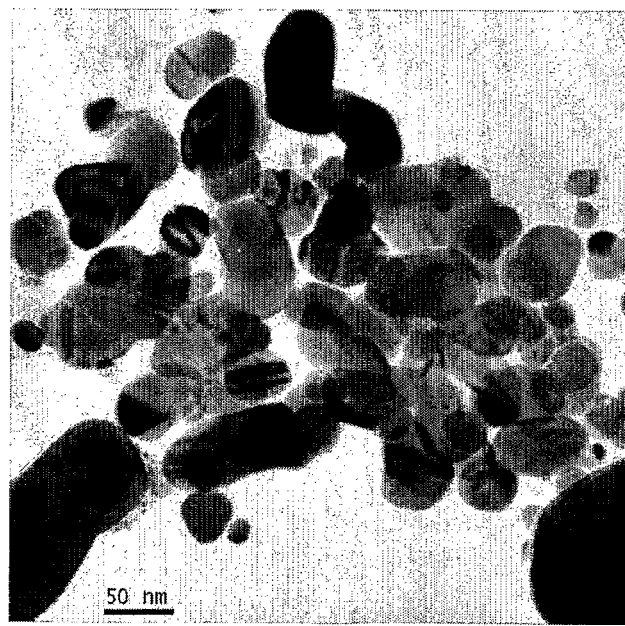

FIG. 4: TEM measurements for a sample of silver nano particles prepared in high concentration (Scale bar in TEM image corresponds to 50 nm)

DESCRIPTION OF PREFERRED EMBODIMENTS

For the purpose of promoting an understanding of the principles of the invention, reference will now be made to the embodiment described and specific language will be used to describe the same. It will nevertheless be understood that no limitation of the scope of the invention is thereby intended, such alterations and further modifications in the process, and such further applications of the principles of the invention therein being contemplated as would normally occur to one skilled in the art to which the invention relates.

It will be understood by those skilled in the art that the foregoing general description and the following detailed description are exemplary and explanatory of the invention and are not intended to be restrictive thereof.

The following description explains the principles of the invention as applied to the production of silver nano particles. It is however believed that the teachings of the document may be equally applied to the other group metals such as gold and platinum. The following description also discusses certain specific compounds such as surfactants and reducing agents to explain the principles of the invention. The invention however is not restricted to such compounds as equivalent chemical compounds may be utilized to achieve the desired end result as taught by the invention.

The invention relates to a method for the production of silver nano particles. More particularly the invention relates to the production of silver nano particles at high molar concentration in an aqueous medium.

The process in accordance with the principle of the invention involves the production of silver nano particles in an aqueous medium by reduction of silver precursor at high concentration by a reducing agent in the presence of surfactant. More specifically the process involves the production of silver nano particles in an aqueous medium by reduction of silver precursor at high concentration by a reducing agent in the presence of surfactant that is dissolved in ethanol or an ethanol-water mixture.

The process involves dissolving a surfactant in ethanol or an ethanol-water mixture to obtain a first solution, adding the first solution to a high concentration solution of a silver precursor in water and reducing the solution so obtained by adding a reducing agent in a predetermined manner to form silver nano particles.

The process involves the production of silver nano particles by dissolving a surfactant in an ethanol or an ethanol-water mixture to obtain a first solution. Preferably the surfactant is dissolved in ethanol. The surfactant in this process stabilizes the silver nano particles by preventing their aggregation in the aqueous medium. In order to obtain high concentration of silver nano particles in an aqueous medium, high concentration of surfactant is required. Ethanol allows for greater solubility of surfactant therefore making it possible to obtain silver nano particles at high concentration in an aqueous medium.

A silver precursor is dissolved in water to obtain a second solution. Preferably the silver precursor is dissolved in water in high molar concentration to obtain the second solution. In accordance with an aspect the silver precursor is dissolved in distilled water.

The first and second solutions are mixed to obtain a third solution. In accordance with an aspect the second solution is added to the first solution and the mixture is stirred for a predetermined period to ensure uniform mixing.

A reducing agent is preferably dissolved in water to obtain a reducing agent solution. In accordance with an aspect the reducing agent is dissolved in distilled water. Preferably the reducing agent is dissolved in cold distilled water.

The reducing agent solution is added to the third solution to form silver nano particles. It is preferred that the reducing agent solution is added in a drop wise manner to the third solution and not as a dumping operation.

The silver nano particles obtained by the addition of reducing agent solution to the third solution are dried to form a powder. Drying can be carried out by any known process including but not limited to air dying and drying in vacuum oven.

According to an aspect of the invention the silver precursor may be a base metal salts including but not limited to $AgNO_3$, $AgBF_4$, $AgPF_6$, $Ag_2O$, $CH_3COOAg$, $AgCF_3SO_3$, $AgClO_4$, $AgCl$, $Ag_2SO_4$, $CH_3COCH-COCH_3Ag$. Preferably the silver precursor is silver nitrate or silver sulphate. According to an aspect the concentration of silver salt in water may range between 0.01M and 2M.

The surfactants according to the invention may be anionic, cationic, non-ionic and mixtures thereof exemplified by sodium alkyl sulfates, sodium bis-2-ethyl-hexyl sulfosuccinate, alkyl triethylammonium bromides and their mixtures. According to a preferred embodiment sodium bis-2-ethyl-hexyl-sulfosuccinate is used as a surfactant.

According to an aspect the percentage of surfactant used is 1 to 75 wt % of silver salt and preferably the percentage of surfactant is 25 wt % of silver salt.

According to an aspect of the invention the reducing agent is sodium borohydride. The amount of reducing agent used is in the range of 0.1 to 10 wt %.

According to an aspect of the invention the silver nano particles obtained by the addition of reducing agent solution to the third solution are dried by any known process to form a powder including but not limited to air drying and drying in a vacuum oven. Preferably the drying is carried in a vacuum oven for a predetermined period at a predetermined temperature. According to a preferred embodiment the aqueous solution of the silver nano particles were dried in a vacuum oven at 50° C. for 8 hours. According to an aspect the phosphorous pentoxide was used as a desiccant. The nano particles so obtained are stored in glass vials for further use.

UV-visible spectroscopy was done on one sample lot of the silver nano particles synthesized in aqueous medium according to the teaching of the document. FIG. 1 shows the UV-visible spectra for a sample of silver nano particles synthesized in aqueous medium.

According to an aspect of the invention TEM measurement was done for a sample of silver nano particles synthesized in aqueous medium. FIG. 4 shows TEM measurements of silver nano particles prepared in high concentration (Scale bar in TEM image corresponds to 50 nm).

According to an aspect of the invention the nano particles so obtained are easily re-dispersible in both aqueous and organic medium.

Figure 2:
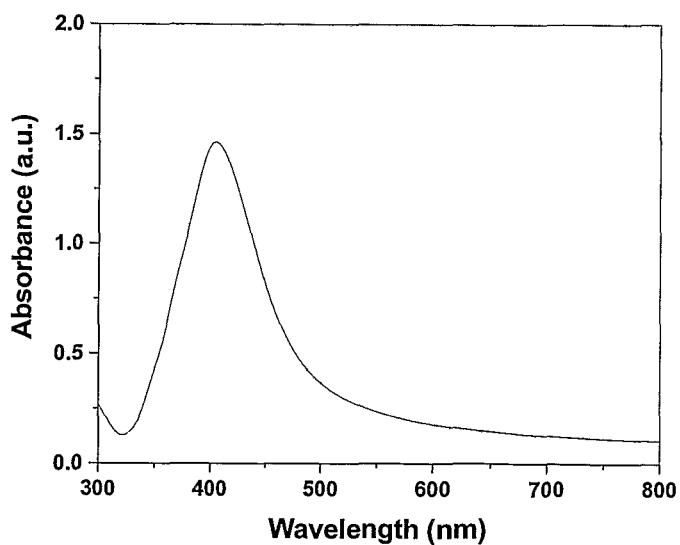

By way of a specific example, 8 mg of silver nano particles powder was re-dispersed in 20 mL of distilled water. The solution was stirred till the silver nano particles powder was completely re-dispersed at room temperature and thereafter UV-visible spectra were recorded. FIG. 2 shows the UV-visible spectra of silver nano particles powder re-dispersed in distilled water (aqueous medium).

By way of a similar example 20 mg of silver nano particles powder was re-dispersed in 20 mL of chloroform. The solution was stirred till the silver nano particles powder was completely re-dispersed at room temperature and thereafter UV-visible spectra were recorded. FIG. 3 shows the UV-visible spectra of silver nano particles powder re-dispersed in chloroform (organic medium).

According to an aspect the invention relates to a process for the production of silver nano particles that involves dissolving sodium bis(2-ethyl hexyl) sulfosuccinate in ethanol to obtain a first solution, dissolving silver nitrate in water to obtain a second solution, adding the second solution to the first solution to obtain a third solution, dissolving sodium borohydride in water to obtain a reducing agent solution, adding the reducing agent solution drop wise to the third solution to form nano particles of silver.

According to an embodiment the invention provides for process for the production of silver nano-particles that involves dissolving sodium bis(2-ethyl hexyl)sulfosuccinate in ethanol to obtain a first solution, dissolving silver sulphate in water to obtain a second solution, adding the second solution to the first solution to obtain a third solution, dissolving sodium borohydride in water to get a reducing agent solution, adding the reducing agent solution drop wise to the third solution to precipitate nano particles of silver.

The silver nano particles obtained from this process are absolutely dry and do not aggregate. They are chemically stable and can be stored either as dry powder or in the form of slurry. These nano particles are capable of being re-dispersed in both aqueous or an organic solvent.

The silver nano particles obtained from this process are generally spherical in shape and range in size from 1 to 1000 nm.

The following examples are provided to explain and illustrate certain preferred embodiments of the process of the invention.

EXAMPLE 1

1.698 gm of sodium bis(2-ethyl hexyl)sulfosuccinate was dissolved in 10 mL of ethyl alcohol at 28° C. The solution was stirred continuously till the sample is completely dissolved. This solution was added to 33.974 gm of silver nitrate dissolved in 50 mL distilled water and stirred continuously for 10 min. Sodium borohydride of 10 wt % was prepared in cold distilled water and used as a reducing agent. 40 mL of sodium borohydride was added to the above solution drop wise till thick slurry of deep dark yellow color was observed indicating formation of silver nanoparticles.

EXAMPLE 2

3.396 gm of sodium bis(2-ethyl hexyl)sulfosuccinate was dissolved in 15 mL of ethyl alcohol at 28° C. The solution was stirred continuously till the sample is completely dissolved. This solution was added to 33.974 gm of silver nitrate dissolved in 45 mL distilled water and stirred continuously for 10 min. Sodium borohydride of 10 wt % was prepared in cold distilled water and used as a reducing agent. 40 mL of sodium borohydride was added to the above solution drop wise till thick slurry of deep dark yellow color was observed indicating formation of silver nanoparticles.

EXAMPLE 3

5.094 gm of sodium bis(2-ethyl hexyl)sulfosuccinate was dissolved in 20 mL of ethyl alcohol at 28° C. The solution was stirred continuously till the sample is completely dissolved. This solution was added to 33.974 gm of silver nitrate dissolved in 40 mL distilled water and stirred continuously for 10 min. Sodium borohydride of 10 wt % was prepared in cold distilled water and used as a reducing agent. 40 mL of sodium borohydride was added to the above solution drop wise till thick slurry of deep dark yellow color was observed indicating formation of silver nanoparticles.

EXAMPLE 4

6.792 gm of sodium bis(2-ethyl hexyl)sulfosuccinate was dissolved in 25 mL of ethyl alcohol at 28° C. The solution was stirred continuously till the sample is completely dissolved. This solution was added to 33.974 gm of silver nitrate dissolved in 35 mL distilled water and stirred continuously for 10 min. Sodium borohydride of 10 wt % was prepared in cold distilled water and used as a reducing agent. 40 mL of sodium borohydride was added to the above solution drop wise till thick slurry of deep dark yellow color was observed indicating formation of silver nanoparticles.

EXAMPLE 5

8.49 gm of sodium bis(2-ethyl hexyl)sulfosuccinate was dissolved in 30 mL of ethyl alcohol at 28° C. The solution was stirred continuously till the sample is completely dissolved. This solution was added to 33.974 gm of silver nitrate dissolved in 30 mL distilled water and stirred continuously for 10 min. Sodium borohydride of 10 wt % was prepared in cold distilled water and used as a reducing agent. 40 mL of sodium borohydride was added to the above solution drop wise till thick slurry of deep dark yellow color was observed indicating formation of silver nanoparticles.

EXAMPLE 6

0.849 gm of sodium bis(2-ethyl hexyl)sulfosuccinate was dissolved in 5 mL of ethyl alcohol at 28° C. The solution was stirred continuously till the sample is completely dissolved. This solution was added to 16.987 gm of silver nitrate dissolved in 45 mL distilled water and the solution was stirred continuously for 10 min. Sodium borohydride of 5 wt % was prepared in cold distilled water and used as a reducing agent. 50 mL of sodium borohydride was added to the above solution drop wise till thick slurry of deep dark yellow color was observed indicating formation of silver nanoparticles.

EXAMPLE 7

1.698 gm of sodium bis(2-ethyl hexyl)sulfosuccinate was dissolved in 10 mL of ethyl alcohol at 28° C. The solution was stirred continuously till the sample is completely dissolved. This solution was added to 16.987 gm of silver nitrate dissolved in 40 mL distilled water and the solution was stirred continuously for 10 min. Sodium borohydride of 5 wt % was prepared in cold distilled water and used as a reducing agent. 50 mL of sodium borohydride was added to the above solution drop wise till thick slurry of deep dark yellow color was observed indicating formation of silver nanoparticles.

EXAMPLE 8

2.547 gm of sodium bis(2-ethyl hexyl)sulfosuccinate was dissolved in 15 mL of ethyl alcohol at 28° C. The solution was stirred continuously till the sample is completely dissolved. This solution was added to 16.987 gm of silver nitrate dissolved in 35 mL distilled water and the solution was stirred continuously for 10 min. Sodium borohydride of 5 wt % was prepared in cold distilled water and used as a reducing agent. 50 mL of sodium borohydride was added to the above solution drop wise till thick slurry of deep dark yellow color was observed indicating formation of silver nanoparticles.

EXAMPLE 9

3.396 gm of sodium bis(2-ethyl hexyl)sulfosuccinate was dissolved in 20 mL of ethyl alcohol at 28° C. The solution was stirred continuously till the sample is completely dissolved. This solution was added to 16.987 gm of silver nitrate dissolved in 30 mL distilled water and the solution was stirred continuously for 10 min. Sodium borohydride of 5 wt % was prepared in cold distilled water and used as a reducing agent. 50 mL of sodium borohydride was added to the above solution drop wise till thick slurry of deep dark yellow color was observed indicating formation of silver nanoparticles.

EXAMPLE 10

4.245 gm of sodium bis(2-ethyl hexyl)sulfosuccinate was dissolved in 25 mL of ethyl alcohol at 28° C. The solution was stirred continuously till the sample is completely dissolved. This solution was added to 16.987 gm of silver nitrate dissolved in 25 mL distilled water and the solution was stirred continuously for 10 min. Sodium borohydride of 5 wt % was prepared in cold distilled water and used as a reducing agent. 50 mL of sodium borohydride was added to the above solution drop wise till thick slurry of deep dark yellow color was observed indicating formation of silver nanoparticles.

We Claim:
1. A process for the preparation of silver nano particles comprising:
dissolving sodium bis(2-ethyl hexyl) sulfosuccinate in ethanol to obtain a first solution;
dissolving a silver precursor in water to obtain a second solution;
forming a third solution by mixing the first solution and the second solution;
dissolving a reducing agent in water to obtain a reducing agent solution; and
adding the reducing agent solution to the third solution to obtain silver nano particles.

2. A process as claimed in claim 1, wherein the silver nano particles are dried to form powder.

3. A process as claimed in claim 1, wherein the silver nano particles have a size in the range of 1 to 1000 nm.

4. A process as claimed in claim 1, wherein the third solution is stirred for uniform mixing.

5. A process as claimed in claim 1, wherein the reducing agent solution is added drop wise to the third solution.

6. A process as claimed in claim 1, wherein the process is carried out at room temperature.

7. A process as claimed in claim 1, wherein the silver precursor is a silver base salt selected from the group consisting of $AgNO_3$, $AgBF_4$, $AgPF_6$, $Ag_2O$, $CH_3COOAg$, $AgCF_3SO_3$, $AgClO_4$, $AgCl$, $Ag_2SO_4$, and $CH_3COCH\text{—}COCH_3Ag$.

8. A process as claimed in claim 1, wherein the molar concentration of silver precursor ranges from 0.01M to 2M.

9. A process as claimed in claim 1, wherein the molar concentration of the silver precursor is at least 0.5M.

10. A process as claimed in claim 1, wherein the percentage of sodium bis(2-ethyl hexyl) sulfosuccinate is 1 to 75 wt % of the silver precursor.

11. A process as claimed in claim 10, wherein the percentage of sodium bis(2-ethyl hexyl) sulfosuccinate is 25 wt % of the silver precursor.

12. A process as claimed in claim 1, wherein the reducing agent is sodium borohydride.

13. A process as claimed in claim 1, wherein the reducing agent is dissolved in cold distilled water.

14. A process as claimed in claim 1, wherein the concentration of reducing agent is 0.1 to 10 wt %.

15. A process for the preparation of silver nano particles comprising:
dissolving sodium bis(2-ethyl hexyl) sulfosuccinate in water and ethanol to obtain a first solution;
dissolving a silver precursor in water to obtain a second solution;
forming a third solution by mixing the first solution and the second solution;
dissolving a reducing agent in water to obtain a reducing agent solution; and
adding the reducing agent solution to the third solution to obtain silver nano particles.

16. A process as claimed in claim 15, wherein the silver nano particles are dried to form powder.

17. A process as claimed in claim 15, wherein the silver nano particles have a size in the range of 1 to 1000 nm.

18. A process as claimed in claim 15, wherein the third solution is stirred for uniform mixing.

19. A process as claimed in claim 15, wherein the reducing agent solution is added drop wise to the third solution.

20. A process as claimed in claim 15, wherein the process is carried out at room temperature.

21. A process as claimed in claim 15, wherein the silver precursor is a silver base salt selected from the group consisting of $AgNO_3$, $AgBF_4$, $AgPF_6$, $Ag_2O$, $CH_3COOAg$, $AgCF_3SO_3$, $AgClO_4$, $AgCl$, $Ag_2SO_4$, and $CH_3COCH\text{—}COCH_3Ag$.

22. A process as claimed in claim 15, wherein the molar concentration of silver precursor ranges from 0.01M to 2M.

23. A process as claimed in claim 15, wherein the molar concentration of the silver precursor is at least 0.5M.

24. A process as claimed in claim 15, wherein the percentage of sodium bis(2-ethyl hexyl) sulfosuccinate is 1 to 75 wt % of the silver precursor.

25. A process as claimed in claim 24, wherein the percentage of sodium bis(2-ethyl hexyl) sulfosuccinate is 25 wt % of the silver precursor.

26. A process as claimed in claim 15, wherein the reducing agent is sodium borohydride.

27. A process as claimed in claim 15, wherein the reducing agent is dissolved in cold distilled water.

28. A process as claimed in claim 15, wherein the concentration of reducing agent is 0.1 to 10 wt %.

\* \* \* \* \*